(12) United States Patent
Kim

(10) Patent No.: US 7,119,566 B2
(45) Date of Patent: Oct. 10, 2006

(54) TEST PROBE ALIGNMENT APPARATUS

(75) Inventor: Kyung Y. Kim, Portland, OR (US)

(73) Assignee: Electro Scientific Industries, Inc., Portland, OR (US)

( * ) Notice: Subject to any disclaimer, the term of this patent is extended or adjusted under 35 U.S.C. 154(b) by 0 days.

(21) Appl. No.: 10/393,955

(22) Filed: Mar. 21, 2003

(65) Prior Publication Data

US 2003/0178988 A1 Sep. 25, 2003

Related U.S. Application Data

(60) Provisional application No. 60/366,912, filed on Mar. 22, 2002.

(51) Int. Cl.
*G01R 31/02* (2006.01)

(52) U.S. Cl. .................................... 324/758
(58) Field of Classification Search ................ 324/758, 324/765, 754, 158.1, 755, 72.5, 761; 439/700, 439/482; 29/852
See application file for complete search history.

(56) References Cited

U.S. PATENT DOCUMENTS

| | | | |
|---|---|---|---|
| 2,275,291 A | 3/1942 | Bannow | |
| 3,899,634 A | 8/1975 | Montone et al. | 178/6.8 |
| 4,266,191 A | 5/1981 | Spano et al. | 324/158 |
| 4,677,474 A | 6/1987 | Sato et al. | 358/101 |
| 4,786,867 A | 11/1988 | Yamatsu | 324/158 |
| 4,864,227 A | 9/1989 | Sato | 324/158 |
| 5,422,579 A | 6/1995 | Yamaguchi | 324/758 |
| 5,528,158 A | 6/1996 | Sinsheimer et al. | 324/758 |
| 5,642,056 A | 6/1997 | Nakajima et al. | 324/758 |
| 5,642,432 A * | 6/1997 | Mori | 382/145 |
| 5,656,942 A | 8/1997 | Watts et al. | 324/754 |
| 5,731,708 A * | 3/1998 | Sobhani | 324/758 |
| 5,982,166 A | 11/1999 | Mautz | |
| 5,994,909 A | 11/1999 | Lucas et al. | |
| 6,002,426 A | 12/1999 | Back et al. | 348/87 |
| 6,166,552 A | 12/2000 | O'Connell | |
| 6,356,093 B1 * | 3/2002 | Nishikawa et al. | 324/758 |

OTHER PUBLICATIONS

International Search Report for International application No. PCT/US03/08913; Jul. 18, 2003; 7 pages.
U.K. Patent Office, Examination Report under Section 18(3), dated Feb. 15, 2005, 3 pgs.

* cited by examiner

*Primary Examiner*—Jeremele Hollington
*Assistant Examiner*—Jimmy Nguyen
(74) *Attorney, Agent, or Firm*—Stoel Rives LLP

(57) ABSTRACT

A test probe alignment apparatus includes a rotatable θ stage that is decoupled from a workpiece positioning stage so that the workpiece positioning stage can move a workpiece in an X-Y plane without moving the θ stage, thereby inhibiting vibration in and inertia of the workpiece positioning stage, and improving the speed and accuracy of workpiece movements. The θ stage is driven for rotation about an axis substantially perpendicular to the X-Y plane. The rotatable stage supports a carriage adapted for holding a probe card. The carriage rotates in concert with the θ stage to thereby align the probe card relative to the workpiece. A Z-stage is operatively engaged with the carriage for moving the carriage along the axis of rotation relative to the workpiece. A computer processor performs coordinate transformations on preprogrammed movement vectors, to adjust for angular misalignment of the workpiece as measured by a position sensor.

21 Claims, 10 Drawing Sheets

TEST PROBE ALIGNMENT APPARATUS

RELATED APPLICATIONS

This application claims the benefit under 35 U.S.C. § 119(e) of U.S. Provisional Patent Application No. 60/366,912, filed Mar. 22, 2002, which is incorporated herein by reference.

TECHNICAL FIELD

This application relates to alignment apparatuses for use in testing, drilling, and trimming of printed circuit boards and integrated circuit substrates and, in particular, to an improved alignment apparatus that isolates a rotational positioning mechanism (θ stage) of the apparatus from the effects of a translating workpiece positioning mechanism (X-Y stage), and vice versa.

BACKGROUND OF THE INVENTION

The manufacture of electronic circuits such as printed circuit boards and integrated circuits typically involves inspection and testing of each circuit in an array of circuit patterns formed on a substrate. Calibration of circuits may include probing and measurement of electrical characteristics of circuit components during a laser trimming operation that adjusts the electrical characteristics of the circuit. For correct test results, the tips of test probes of a probe card must be accurately aligned with contact locations or electrode pads of the circuit. Probe alignment systems use mechanical positioning equipment that adjusts the position of the substrate, the probe card, or both, to maintain accurate alignment across the array of circuit patterns.

FIG. 1 illustrates a prior-art test probing system 10, in which a substrate 12 is supported on a chuck 16 of a motorized workpiece positioning stage 20. Positioning stage 20 includes a linear positioning component, X-Y stage 22, supported on a platen 24, for movement in a horizontal plane in orthogonal directions X and Y. Positioning stage also includes a rotational positioning component, theta (θ) stage 26, supported on the X-Y stage 22 for rotation of the chuck 16 about a vertical Z axis. For reference, a Cartesian coordinate system frame of reference 30, indicates the directions X, Z, and θ (the Y direction is perpendicular to the view and is not shown in FIG. 1). A probe card carriage 34 holds a probe card 38 above the positioning stage 20 while a machine vision system 42, including a camera 44, controls the rotational (θ) and translational (X-Y) alignment of the substrate 12 to align it with probes 48 of the probe card 38. The probe card carriage 34 is supported below a motorized Z stage 50 that is actuated, after alignment of the probe card 38, to move the probe card 38 downwardly along the Z axis to press the probes 48 against the substrate 12 for testing of a circuit formed on the substrate 12. A Z-drive mechanism 56, which is supported on a stationary probe base 60, provides driving force for Z stage 50.

Because multiple copies of a circuit are typically formed on a single substrate in a regular array pattern, many known systems are controlled with an automated step-and-repeat positioning program that repetitively indexes the substrate in the X-Y plane between successive probing operations. In each probing operation, tips of the test probes are pressed against electrode pads of the circuit before performing electrical testing and/or trimming of the circuit. After testing and/or trimming, the test probes are then lifted away from the substrate before moving (stepping) the substrate to align the probes with the next circuit or the next test position on the same circuit.

Conventional alignment equipment allows the substrate to be accurately aligned with the X and Y axes by interposing a θ stage between the X-Y stage and the substrate, as shown in FIG. 1. This configuration of the θ and X-Y stages simplifies subsequent indexing of the substrate, requiring only a simple X or Y translation motion for each step, as described in the Background of the Invention section of U.S. Pat. No. 4,266,191 of Spano et al. In two other equipment designs, described in U.S. Pat. No. 4,677,474 of Sato et al. and U.S. Pat. No. 4,786,867 of Yamatsu, a second rotational positioning stage is provided for aligning the probe card with the X and Y axes of the X-Y stage, thereby enabling probe/substrate alignment to be more accurately maintained across the entire array of circuit patterns of the substrate. However, because these prior art mechanisms all include a θ stage tied to the X-Y stage, every adjustment of the θ stage requires a subsequent alignment compensation of the X-Y stage, as explained by Spano et al. at column 4, lines 16–24 of the '191 patent.

Furthermore, in systems having a θ stage supported on the X-Y stage, the mass of the θ stage adds to the inertia of the entire workpiece positioning stage. The added inertia slows movement in the X and Y directions and raises the center of mass of the workpiece positioning stage, thereby affecting positioning speed and accuracy.

The θ stage can also be a source of positioning error due to vibration and backlash that are induced in the θ stage mechanism each time the X-Y stage is actuated. Overall, the coupling of the θ stage with the workpiece positioning stage in conventional test probe alignment systems tends to reduce system throughput. Attempts to increase X-Y stage speed by minimizing the mass of the θ stage and reducing the height and/or mass of the chuck tend to increase backlash, decrease stiffness, sacrifice vibration resistance, and increase settling time of the workpiece positioning stage. Attempts to increase the resolution and accuracy of the θ stage also tend to increase the mass and height of the workpiece positioning stage. Consequently, designers of prior art systems have been forced to compromise system throughput to improve positioning accuracy, and vice versa.

The present inventor has recognized a need for an improved test probe alignment apparatus that will facilitate increased test throughput and improved probe alignment accuracy.

SUMMARY OF THE INVENTION

An alignment apparatus is adapted for aligning a set of test probes or other tools with a set of contact areas on a substrate, such as a printed circuit board panel or finished silicon wafer. The substrate is supported on a chuck of a workpiece positioning stage for linear movement in an X-Y plane. The alignment apparatus also facilitates engagement of the test probes with the contact areas on the substrate after alignment, by driving the test probes in a Z direction. The alignment apparatus includes a rotatable stage that is decoupled from the workpiece positioning stage so that the chuck can move in the X-Y plane without moving the rotatable stage, thereby inhibiting vibration in and inertia of the workpiece positioning stage, and improving the speed and accuracy of chuck movements.

The rotatable stage is driven for rotation about an axis of rotation substantially perpendicular to the plane of movement of the chuck. The rotatable stage preferably supports a carriage adapted for mounting a set of probes. The carriage rotates in concert with the rotatable stage when the rotatable stage is rotated, to thereby align the set of probes with the contact areas on the substrate. After alignment of the probes, the probing stage is driven for linear translation of the carriage relative to the rotatable stage along the axis of rotation of the rotatable stage to thereby engage the probes with the contact areas on the substrate.

Because the rotatable stage is decoupled from the workpiece positioning stage, it is less constrained by space and mass limitations than prior art systems. Thus, it can include larger, more massive mechanisms that are more accurate than the θ stages used with workpiece positioning stages of prior-art test systems.

Additional aspects and advantages of the invention will be apparent from the following detailed description of preferred embodiments, which proceeds with reference to the accompanying drawings.

BRIEF DESCRIPTION OF THE DRAWINGS

In the figures, like reference numerals refer to same or similar parts or features.

DETAILED DESCRIPTION OF PREFERRED EMBODIMENTS

Throughout the specification, reference to "one embodiment," or "an embodiment," or "some embodiments" means that a particular described feature, structure, or characteristic is included in at least one embodiment. Thus, appearances of the phrases "in one embodiment" or "in an embodiment" or "in some embodiments" in various places throughout the specification are not necessarily all referring to the same embodiment or embodiments.

Furthermore, the described features, structures, or characteristics may be combined in any suitable manner in one or more embodiments. Those skilled in the art will recognize that the invention can be practiced without one or more of the specific details, or with other methods, components, materials, etc. In other instances, well-known structures, materials, or operations are not shown or not described in detail to avoid obscuring aspects of the embodiments.

Figure 1:
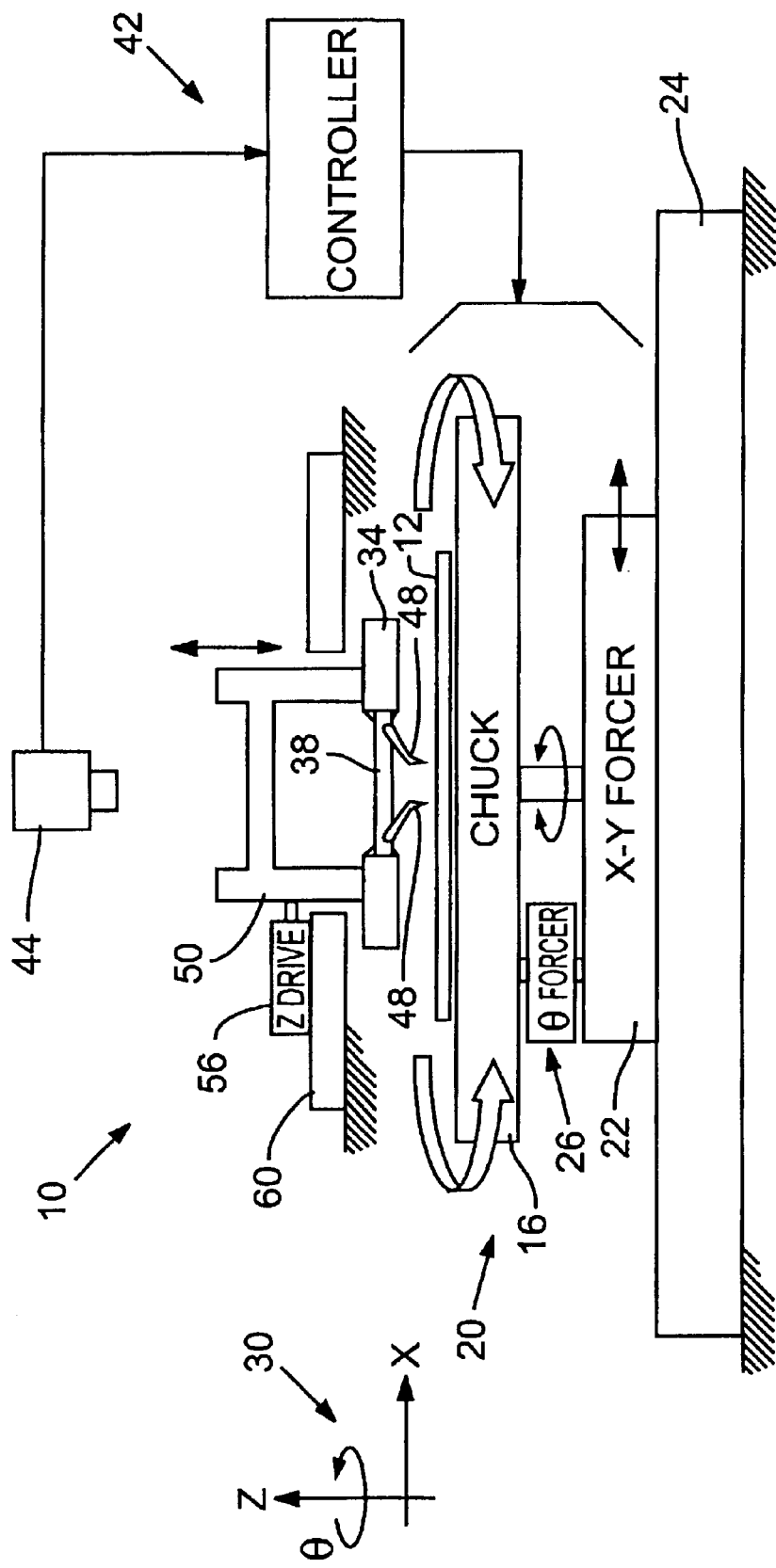
FIG. 1 is a schematic front elevation of a prior-art test probing system.
Figure 2:
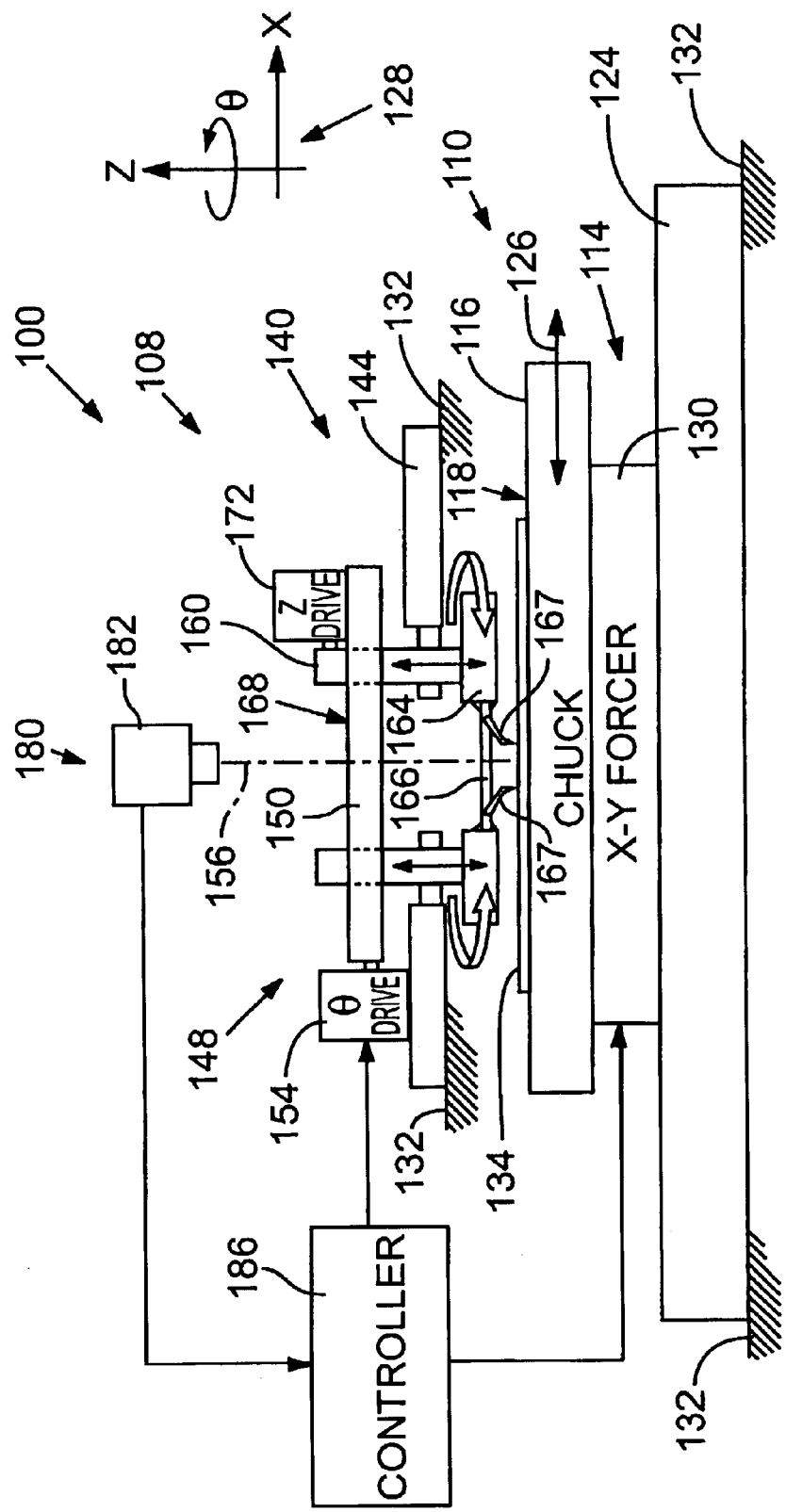
FIG. 2 is a schematic front elevation of a test probing system including a test probe alignment apparatus in accordance with simplified first embodiment.

FIG. 2 is a schematic front elevation of a test probing system 100 including a test probe alignment apparatus 108 in accordance with simplified first preferred embodiment. With reference to FIG. 2, test probing system 100 includes a workpiece positioning stage 110 consisting essentially of an X-Y stage 114 that supports a chuck 116 having an upper surface 118. The X-Y stage 114 moves over a stationary horizontal platen 124 in orthogonal X and Y directions lying in a substantially horizontal plane (the X direction is indicated by arrow 126 and Cartesian coordinate reference frame 128; the Y direction extends perpendicular to the drawing and is, therefore, not depicted on reference frame 128) in response to actuation of an X-Y forcer mechanism 130 of X-Y stage 114. X-Y stage 114 may be in a stacked configuration, having the X-stage supported on the Y-stage or vice versa; however, X-Y stage preferably includes an X-Y dual axis single plane stepping motor with air bearing. In an alternative embodiment (not shown) X-Y table 114 may include non-orthogonal forcers, so long as they do not cause chuck 116 to rotate. Platen 124 may be securely mounted to a frame 132 of test probing system 100, for example.

Upper surface 118 of chuck 116 is sized to fit a substrate 134 on which one or more circuits are formed. Preferred embodiments are used in connection with testing and/or trimming of circuits on substrates such as printed circuit boards (PCBs), including PCB panels carrying an array of printed circuit boards (not shown). For PCBs and PCB panels, chuck 116 could be sized up to 26 inches wide and 30 inches long, for example, and weigh up to 17 pounds (mass 7.7 kg). Embodiments are also contemplated to be scaled down for use in testing smaller substrates, such as miniaturized integrated circuits and wafers having an array of integrated circuit dice formed thereon, in which case chuck 116 and X-Y stage 114 would be sized much smaller than for PCB testing.

A probe stage 140 includes a stationary base plate 144, which may be securely mounted to frame 132 of test probing system 100 or to another rigid stationary support. A θ stage 148 is mounted on base plate 144 and includes a pedestal 150 that driven by a θ drive mechanism 154 of θ stage 148 for rotation about an axis of rotation 156 perpendicular to the X-Y plane in which chuck 116 moves. A translating Z stage 160 is supported by pedestal 150 and moves with pedestal 150 in response to actuation of θ drive mechanism 154. A carriage 164 is hung from Z stage 160 below pedestal 150 and adapted for mounting a probe card 166 having a set of test probes 167. Probe card 166 is mounted such that probes 167 face chuck 116. Carriage 164 rotates in concert with Z stage 160 when θ stage 148 is rotated, to thereby align the set of probes 167 with contact areas (not shown) on substrate 134. Z stage 160 preferably extends beyond an upper face 168 of pedestal 150 where Z stage 160 is coupled to a Z-drive mechanism 172 that drives Z stage 160 and carriage 164 for linear translation along Z-axis relative to θ stage 148. Driving of Z stage 160 and carriage 164 along the Z-axis causes the tips of test probes 167 to press against the contact areas of substrate 134 for purposes of electrical testing, laser trimming, or any other process involving probing.

In an alternative embodiment (not shown) Z stage 160 and/or Z-drive mechanism 172 may be arranged so that Z stage 160 or Z-drive mechanism 172 or both do not rotate together with θ stage 148 and carriage 164. Decoupling of Z stage 160 or Z-drive mechanism from θ stage 148 would require a special rotating- or slide bearing- type coupling to allow carriage 164 to rotate independently of the Z stage while allowing the Z stage to accurately move carriage 164 along the Z axis.

Alignment of the set of probes 167 with the contact pads of substrate 134 is accomplished in the preferred embodiment using a position sensor 180, such as a digital video camera 182, coupled to a machine vision system (not shown) and a motion controller 186. Motion controller 186 includes control software stored in a computer-readable data storage medium, such as computer memory (not shown) of motion controller 186 or a remote data storage device that can be accessed by motion controller 186. A computer-readable data storage medium accessible by motion controller 186 is also adapted to store movement vector data representing preprogrammed movements of X-Y stage 114, θ stage 148, and/or Z stage 160. A step-and-repeat indexing plan is stored in the data storage medium for positioning substrate 134 to test multiple sets of circuits or dice on substrate 134. In accordance with a preferred embodiment, motion controller 186 uses position information sensed by sensor 180 to adjust the alignment of θ stage 148 and X-Y stage 114 before or during execution of the preprogrammed movements.

Figure 3:
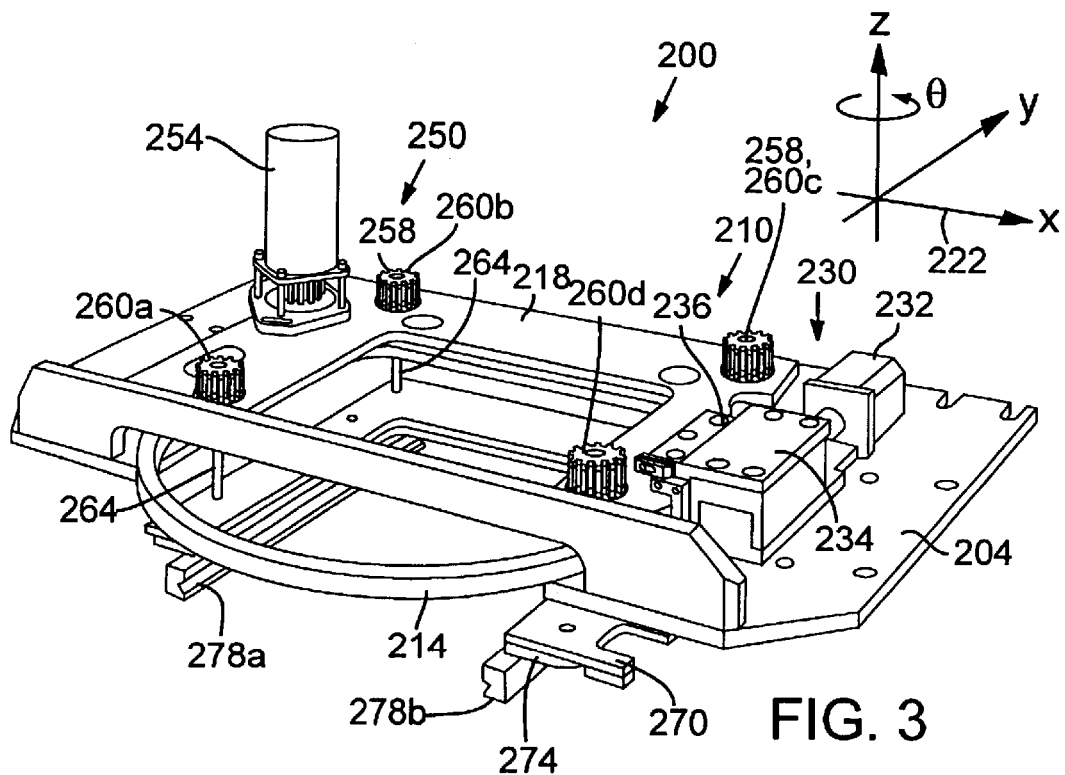
FIG. 3 is a top perspective view showing a test probe alignment apparatus in accordance with a second embodiment, with Z-drive belts of the alignment apparatus omitted for clarity.
Figure 4:
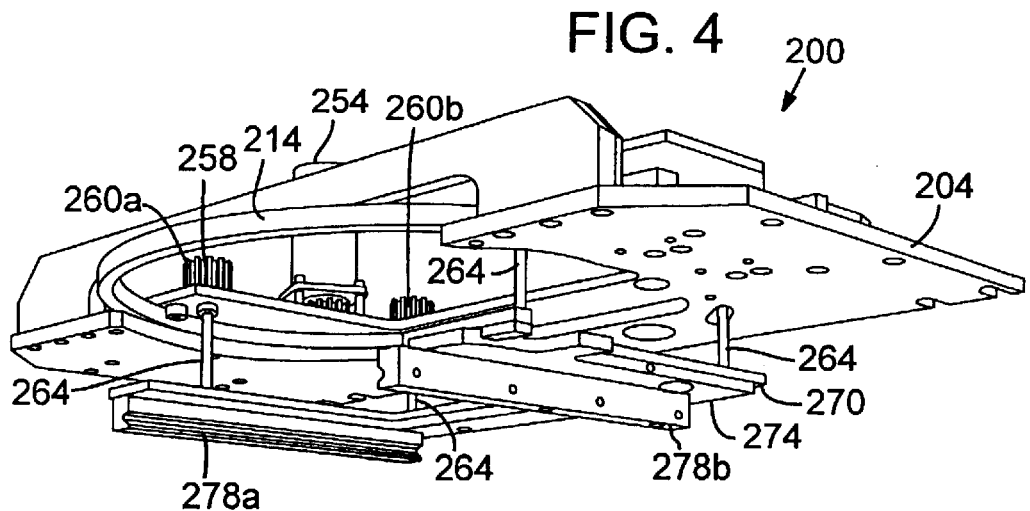
FIG. 4 is a bottom perspective view of the test probe alignment apparatus of FIG. 3.

Referring now to FIGS. 3 and 4, respective top and bottom perspective views show a test probe alignment apparatus 200 in accordance with a second preferred embodiment. FIG. 3 omits an X-Y stage and detail of probe cards and probes, which are components well known in the art. The manner of using the X-Y stage and probe cards in conjunction with test probe alignment apparatus 200 will be readily appreciated and understood by anyone of skill in the art. Alignment apparatus 200 includes a stationary base plate 204 that is mounted to a frame (not shown) above the X-Y stage (not shown). A θ stage 210 includes a ring bearing 214 having a pair of opposing bearing races (not shown), including a first (fixed) bearing race securely attached to base plate 204. A pedestal 218 is mounted to a second (movable) one of the bearing races so that it rotates relative to base plate 204 about the Z-axis (see coordinate reference frame 222).

Figure 11:
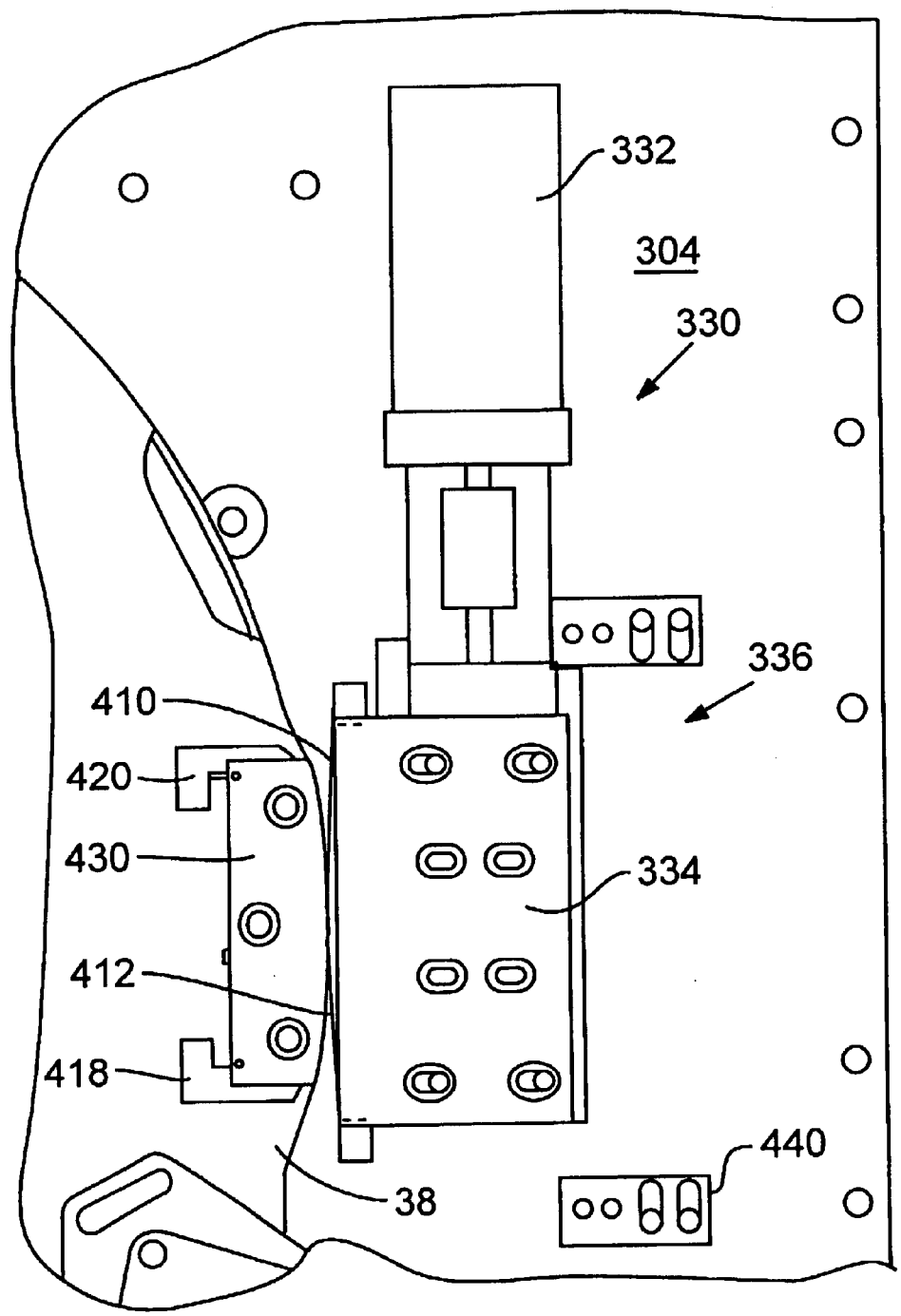
FIG. 11 is an enlarged partial top plan view of the test probe alignment apparatus of FIG. 5, showing detail of a θ stage driver mechanism.

A θ drive mechanism 230 includes a θ drive servo 232 that actuates a linear slide 234 of a taut-band mechanism 236, which is connected to pedestal 218. Taut-band mechanism 236 provides highly reliable and precise control for rotation of θ stage 210, while eliminating backlash. Actuation of linear slide 234 causes θ stage 210 to rotate up to 7.0 degrees of total travel and with a resolution of 0.0002 degrees, for example. Taut-band mechanism 236, which is described below with reference to FIG. 11, is a larger mechanism than possible to fit in prior-art test probe systems where the θ stage is coupled to the X-Y stage. However, since θ stage 210 is mounted to a stationary base 204 and with unobstructed headroom, the alignment apparatus 200 can accommodate larger drive mechanisms, such as taut-band mechanism 236. Skilled persons will appreciate that other types of rotary drive mechanisms (not shown) could be used in place of taut-band mechanism 236.

Test probe alignment apparatus also includes a Z stage 250, comprising a Z-stepper motor 254 coupled to Z-pulleys 258 of each of four Z-screws 260a, 260b, 260c, and 260d, via a set of timing belts (omitted for clarity). Non-rotating lead screws 264 of Z-screws 260a–d are threaded into and extend downwardly from Z-pulleys 258 through pedestal 218 so that they telescope in the Z direction in response to actuation of Z-stepper motor 254. A carriage 270 is rigidly attached to the ends of lead screws 264 for movement therewith. A probe card holder 274 is attached to carriage 270 and includes a pair of opposing card slot rails 278a and 278b that together are adapted to receive and securely hold a probe card (not shown). Skilled persons will appreciate that other types of drive mechanisms (not shown) could be used in place of Z-stepper motor 254, Z-pulleys 258, and Z-screws 260a–d for translation of carriage 270 in the Z direction.

Other configurations of θ stage 210 and Z stage 250 are also contemplated to be within the scope of the present application. For example, in an alternative embodiment (not shown) a Z-stage could directly connect to pedestal 218 and a lightweight θ stage could be mounted to a working end of the Z-stage.

Figure 5:
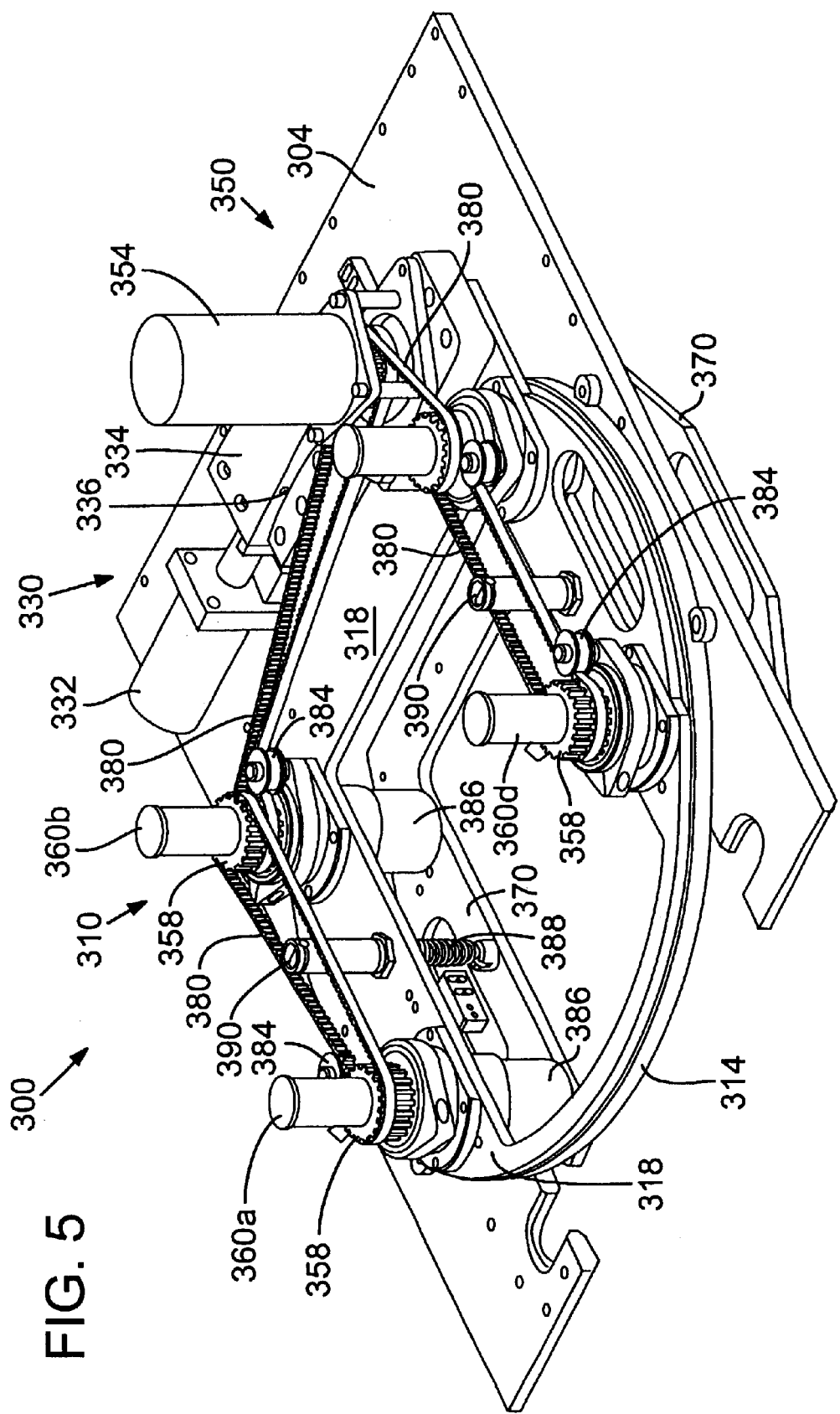
FIG. 5 is a top right frontal perspective view of a third embodiment test probe alignment apparatus, with a probe card holder of the probe alignment apparatus omitted.
Figure 6:
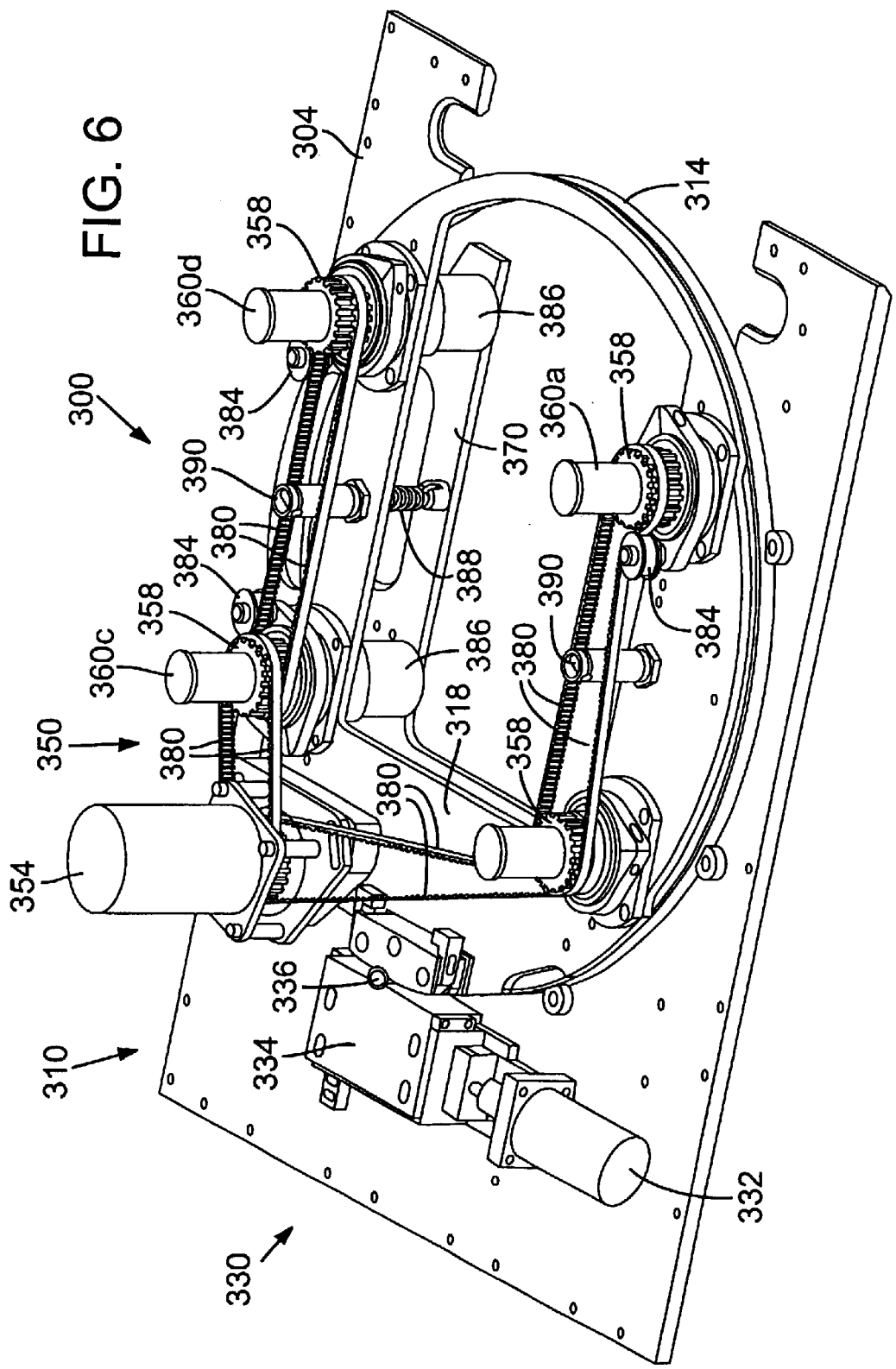
FIG. 6 is a top left perspective view of the test probe alignment apparatus of FIG. 5.
Figure 7:
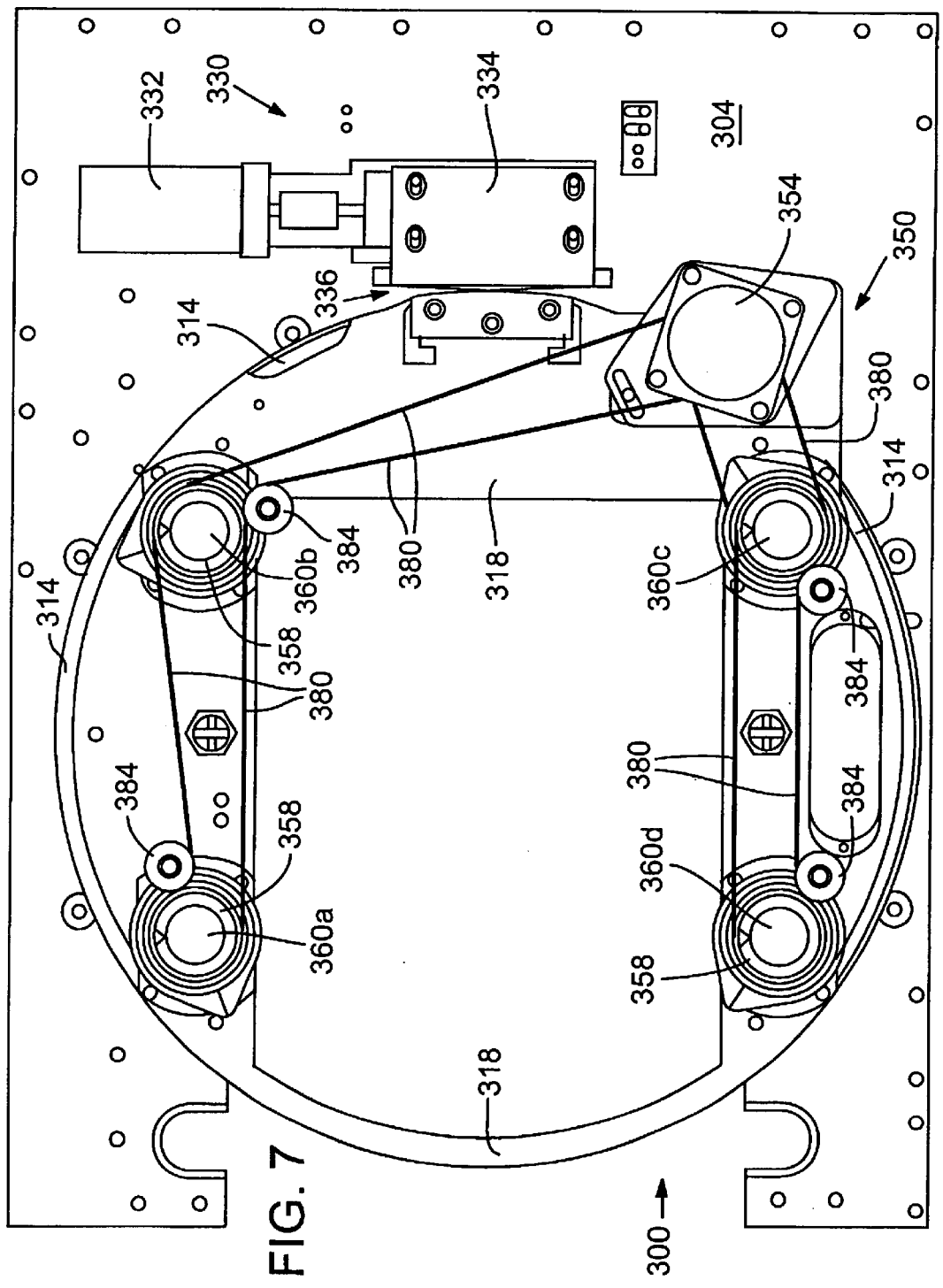
FIG. 7 is a top plan view of the test probe alignment apparatus of FIG. 5.
Figure 8:
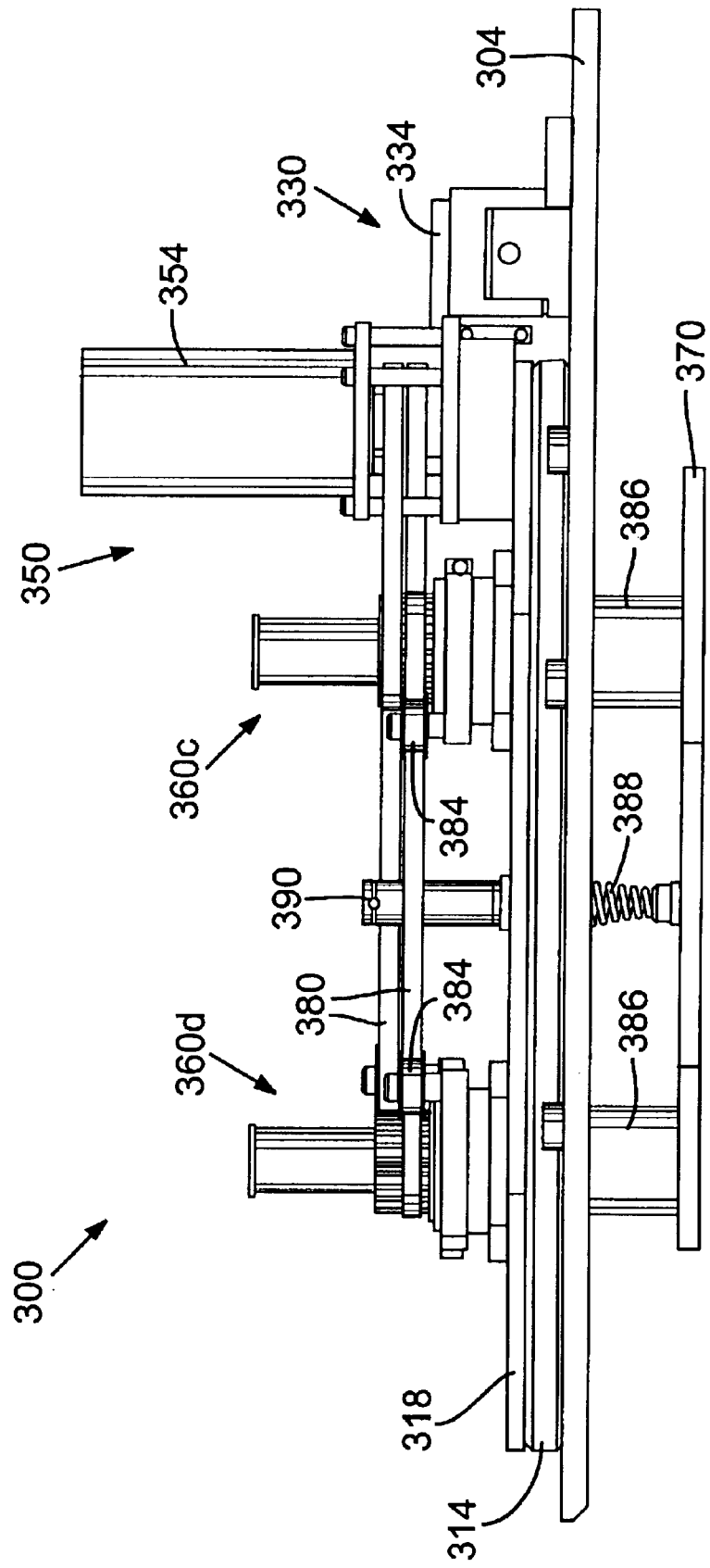
FIG. 8 is a right side elevation of the test probe alignment apparatus of FIG. 5.
Figure 9:
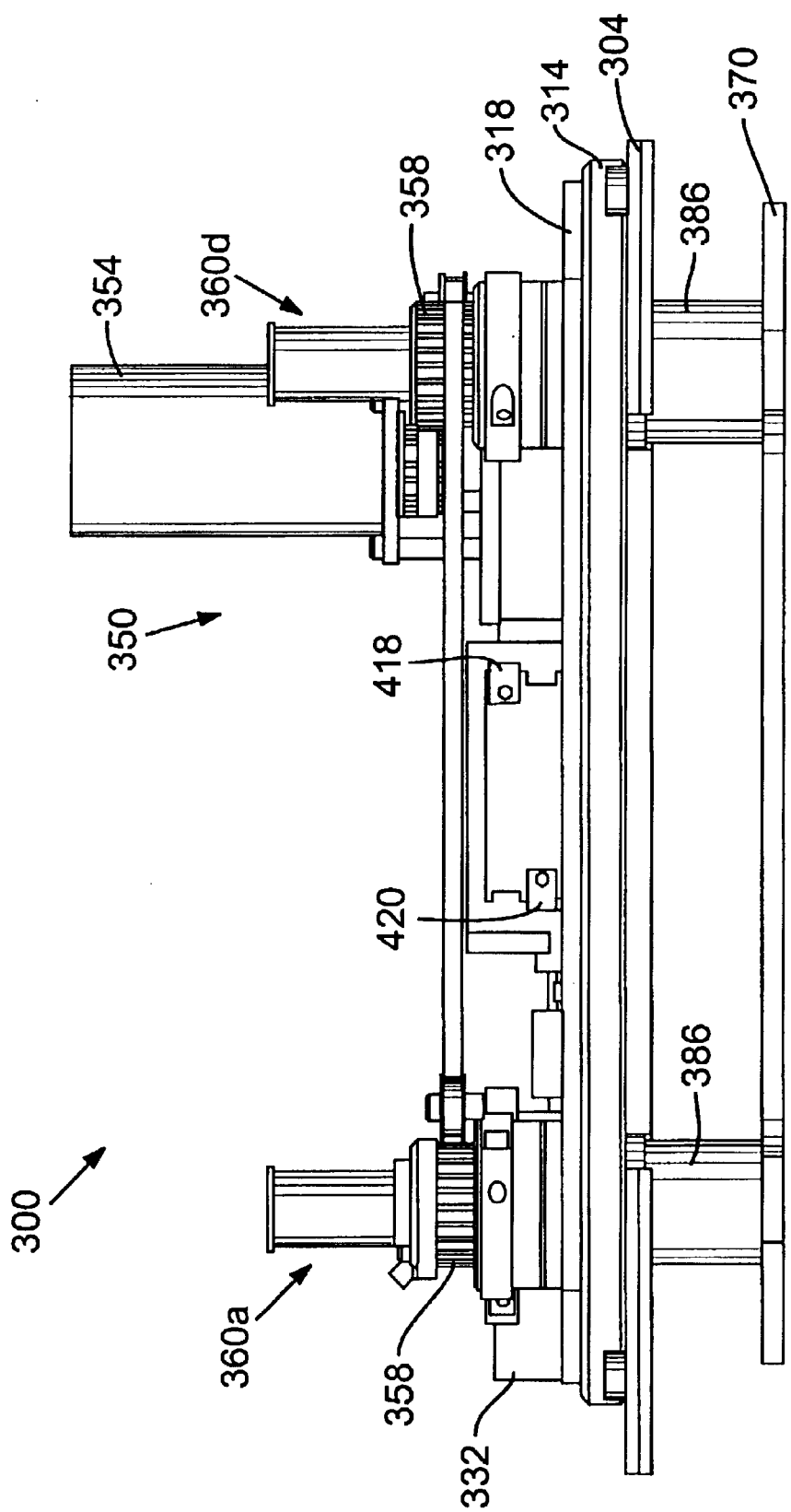
FIG. 9 is a front side elevation of the test probe alignment apparatus of FIG. 5.
Figure 10:
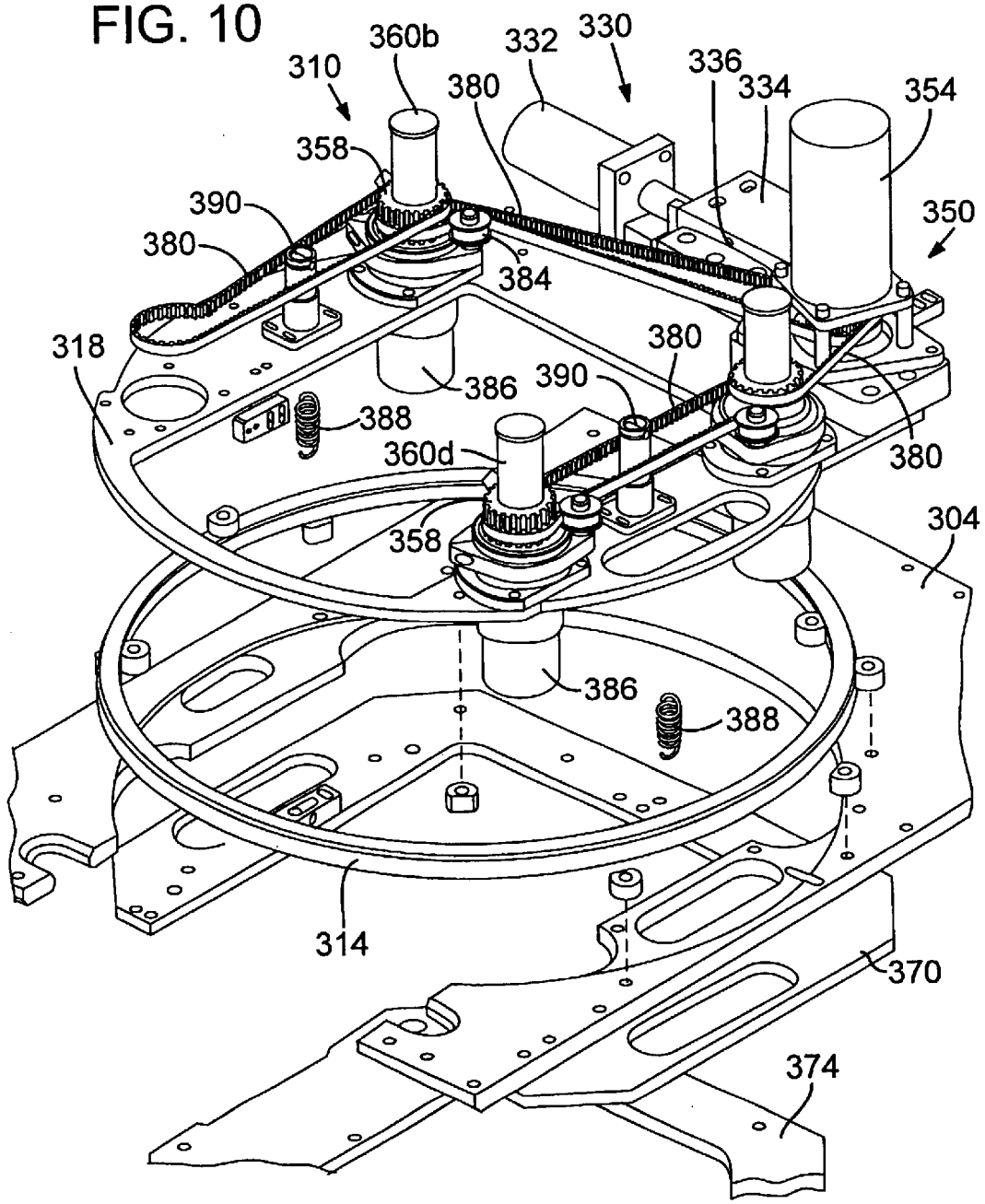
FIG. 10 is an exploded view of the test probe alignment apparatus of FIG. 5, with a left front Z-screw of the alignment apparatus omitted to show detail of a θ stage pedestal of the alignment apparatus.

FIGS. 5 and 6 are respective top/right frontal perspective and top left perspective views of a third embodiment test probe alignment apparatus 300, with a probe card holder of the probe alignment apparatus omitted for clarity. FIG. 7 is a top plan view of test probe alignment apparatus 300. FIGS. 8 and 9 are respective right side and front side elevations of test probe alignment apparatus 300. FIG. 10 is an exploded view of test probe alignment apparatus 300, with a left front Z-screw 360a of the alignment apparatus omitted to show detail of a θ stage pedestal 318 of the alignment apparatus. Many of the components of this third embodiment test probe alignment apparatus 300 are identical in function and similar in appearance to the corresponding components of the second embodiment test probe alignment apparatus 200. Consequently, in FIGS. 5–10, many elements are shown with reference numbers that have the same last two digits and the reference numbers shown in of FIGS. 3 and 4 for corresponding components. These elements are listed below by name for reference.

| Ref. No. in FIGS. 3 and 4 | Ref. No. in FIGS. 5–10 | |
|---|---|---|
| 204 | 304 | base plate |
| 210 | 310 | θ stage |
| 214 | 314 | ring bearing |
| 218 | 318 | pedestal |
| 230 | 330 | θ drive mechanism |
| 232 | 332 | θ drive servo |
| 234 | 334 | linear slide |
| 236 | 336 | taut-band mechanism |
| 250 | 350 | Z stage |
| 254 | 354 | Z-stepper motor |
| 258 | 358 | Z-pulleys |
| 260a–d | 360a–d | Z-screws |
| 270 | 370 | carriage |
| 274 | 374 | probe card holder (FIG. 10 only) |

The following is a description of the components of third embodiment test probe alignment apparatus 300 that differ from those of second embodiment apparatus 200 or which do not appear in FIGS. 3 and 4. With reference to FIGS. 5–10, a set of four Z-drive belts 380 engages Z-pulleys 358 and Z-stepper motor 354 to drive Z-screws 360a–d in response to actuation of Z-stepper motor 254. Z-drive belts 380 are preferably endless timing belts, but could be implemented with other types of linkage devices. Multiple tensioner idlers 384 are provided for maintaining tension of Z-drive belts 380. To improve accuracy of motion in the Z direction, Z-screws 360a–d are preferably ball screws. A set of dust covers 386 is provided to protect the screw portions (not shown) of Z-screws 360a–d. Further, a pair adjustable anti-backlash springs 388 is provided for biasing carriage 370 along the Z-axis to eliminate axial play in the ball screws. Springs 388 are connected at one end to carriage 370 and their other end to a pair of spring posts 390 mounted on pedestal 318. Springs 388 are preferably in tension to urge carriage 370 toward pedestal 318. Spring posts 390 facilitate installation and adjustment of a spring preload of springs 388.

FIG. 11 is an enlarged partial top plan view of the test probe alignment apparatus 300, showing detail of θ drive mechanism 330. With reference to FIG. 11, taut-band mechanism 336 includes a crossed pair of flexible bands 410 and 412, which are highly inelastic along their lengths. Each of the bands 410 and 412 extend between and are attached at one end to linear slide 334, and at their other end to respective adjustment clamps 418 and 420 (see also FIG. 9). Throughout the range of travel of θ drive mechanism 330, the bands 410 and 412 remain in contact with a curved face of a taut block 430, to which adjustment clamps 418 and 420 are mounted. A home switch 440 is provided for re-zeroing taut-band mechanism 336

To streamline testing of an array of circuits arranged in a predetermined array pattern on the substrate, such as a rectangular or linear array pattern, for example, the test probe alignment apparatus may include a memory adapted to store an indexing plan corresponding to the circuit array pattern. The indexing plan includes a set of movement vectors defining spatial offsets between pairs of circuits in the array pattern and may be preprogrammed in memory for a known array pattern or "taught" or otherwise input to the system when needed. A position sensor, such as a machine vision system and camera 182 (FIG. 2), is provided for measuring angular misalignment of the array pattern relative to orthogonal axes of the chuck within the plane of movement of the chuck. Fiducial marks on the substrate, which are typically formed in the same lithography process as the array pattern, facilitate accurate optical measurement by the position sensor. The position sensor may also measure the translational misalignment of the array pattern relative to the orthogonal axes. To compensate for the angular misalignment, motion controller 186, in communication with the memory and the sensor, performs a coordinate transformation on the movement vectors based on the angular misalignment measured by the system.

As described in the Background of the Invention section, above, in prior art systems having a θ stage tied to the X-Y stage, every adjustment of the θ stage requires a subsequent alignment compensation of the X-Y stage. Probe alignment apparatuses in accordance with the various embodiments described herein eliminate the need to twice perform the steps of measuring the misalignment and adjusting the position of the substrate (once for angular position adjustment and once for adjusting in the translational position). Thus, the invention obviates the two stage alignment process of the prior art by using the angular and/or positional offset of the substrate measured by the sensor to compensate in software (with coordinate transformations) for misalignment between the array pattern and the axes of movement of the chuck. In addition, elimination of the θ stage from the workpiece positioning stage in accordance with the preferred embodiments reduces the mass of the workpiece positioning stage, decreases vibration, and lowers its center of mass, thereby allowing increased speed, increased acceleration, decreased settling time, and improved positioning accuracy, for achieving improved throughput and yield.

It will be obvious to those having skill in the art that many changes may be made to the details of the above-described embodiments without departing from the underlying principles of the invention. For example, in some circuit manufacturing processes, an alignment apparatus may be used in connection with mechanical and laser via drilling operations. These alignment apparatuses operate similarly to test probe alignment systems and are subject to similar problems. Consequently, the present invention is equally useful for use with tools such as via drilling equipment. Furthermore, those skilled in the art should appreciate that the orientation of X, Y, Z, and θ are shown in a preferred configuration and that the invention could be implemented in many other configurations, such as with the chuck moving in a vertical plane and the probes moving along a horizontal axis toward the chuck, for example. The scope of the present invention should, therefore, be determined only by the following claims.

What is claimed is:

1. A test probe alignment apparatus for aligning a set of test probes with contact areas on a substrate, the substrate being supported on a chuck adjacent the test probe alignment apparatus and driven for movement in a plane, comprising:

a rotatable stage having an axis of rotation substantially perpendicular to the plane of movement of the chuck, the rotatable stage decoupled from the chuck so that the chuck can move in the plane without moving the rotatable stage therewith;

a carriage supported on the rotatable stage for rotation therewith, the carriage adapted to support the set of test probes; and a translating stage operatively engaged with the carriage and driven for linear translation of the carriage relative to the rotatable stage along the axis of rotation of the rotatable stage, to thereby move the test probes into engagement with the contact areas, rotation of the rotatable stage causing the set of test probes to rotate around the axis of rotation for aligning the test probes with the contact areas before moving the test probes into engagement with the contact areas.

2. The test probe alignment apparatus of claim 1 in which the chuck is movable along two orthogonal axes in the plane, and in which the substrate includes an array of circuits arranged in a predetermined array pattern, each circuit including a set of contact areas, the array pattern has an angular misalignment relative to the orthogonal axes, and further comprising:

a computer-readable data storage medium adapted to store an indexing plan corresponding to the array pattern, the indexing plan including a set of movement vectors that represent spatial offsets between the sets of contact areas of one or more pairs of the circuits of the array;

a position sensor for measuring the angular misalignment of the array pattern; and a motion controller in communication with the data storage medium and the sensor, the motion controller including a computer processor that performs coordinate transformations on the movement vectors based on the angular misalignment of the array pattern measured by the position sensor.

3. The test probe alignment apparatus of claim 2 in which the position sensor includes a camera.

4. The test probe alignment apparatus of claim 2 in which the computer-readable data storage medium includes a memory.

5. The test probe alignment apparatus of claim 1, further comprising a workpiece positioning stage supporting the chuck and driven for movement in the plane.

6. The test probe alignment apparatus of claim 1 in which the rotatable stage includes a ring bearing.

7. The test probe alignment apparatus of claim 1, further comprising a taut-band mechanism operatively engaged with the rotatable stage for rotatably driving the rotatable stage.

8. The test probe alignment apparatus of claim 1 in which the translating stage is supported on the rotatable stage for movement therewith.

9. The test probe alignment apparatus of claim 1, further comprising an anti-backlash spring operably interconnecting the carriage and the rotatable stage for biasing the carriage relative to the rotatable stage.

10. A probe alignment apparatus for aligning a set of probes with contact areas on a substrate, the substrate being supported on an independently movable X-Y stage separate from the probe alignment apparatus and driven for movement in a plane, comprising:
- a θ stage having an axis of rotation substantially perpendicular to the plane of movement of the X-Y stage, the θ stage decoupled from the X-Y stage so that movement of the X-Y stage does not impart movement to the θ stage and movement of the θ stage does not impart movement to the X-Y stage;
- a carriage coupled to the θ stage for rotation therewith, the carriage adapted to support the set of probes; and
- a Z-stage operatively engaged with the carriage to drive the carriage linearly relative to the θ stage along the axis of rotation of the θ stage, to thereby move the probes into engagement with the contact areas,
- rotation of the θ stage causing the set of probes to rotate around the axis of rotation for aligning the probes with the contact areas before moving the probes into engagement with the contact areas.

11. The probe alignment apparatus of claim 10 in which the X-Y stage is movable along two orthogonal axes in the plane and constrained to prevent rotational movement, and in which the substrate includes an array of circuits arranged in a predetermined array pattern, each circuit including a set of contact areas, the array pattern has an angular misalignment relative to the orthogonal axes, and further comprising:
- a computer-readable data storage medium adapted to store an indexing plan corresponding to the array pattern, the indexing plan including a set of movement vectors that represent spatial offsets between the sets of contact areas of one or more pairs of the circuits of the array;
- a position sensor for measuring the angular misalignment of the array pattern;
- a computer processor in communication with the data storage medium and the sensor, the computer processor operable to perform coordinate transformations on the movement vectors based on the angular misalignment of the array pattern measured by the position sensor; and
- a motion controller in communication with the computer processor for controlling movement of the X-Y stage based on the transformed movement vectors.

12. The probe alignment apparatus of claim 11, in which the position sensor includes a camera.

13. The probe alignment apparatus of claim 10, further comprising a workpiece positioning stage supporting the chuck and driven for movement in the plane independently of the rotational movement of the θ stage.

14. The probe alignment apparatus of claim 10 in which the θ stage includes a ring bearing.

15. The probe alignment apparatus of claim 10, further comprising a taut-band mechanism operatively engaged with the θ stage for rotating the θ stage.

16. The probe alignment apparatus of claim 10 in which the translating stage is supported on the θ stage for movement therewith.

17. The probe alignment apparatus of claim 10, further comprising a means for biasing the carriage relative to the θ stage to reduce the effects of backlash in the Z-stage.

18. An alignment apparatus, comprising:
- a workpiece positioning stage including a chuck for supporting a substrate thereon, the workpiece positioning stage being adjustable for movement in a plane and constrained to prevent rotational movement of the chuck;
- a rotatable stage separate from the workpiece positioning stage and having an axis of rotation substantially perpendicular to the plane of movement of the workpiece positioning stage, each of the rotatable stage and the workpiece positioning stage being independently adjustable without imparting movement to the other;
- a tool supported on the rotatable stage for rotation therewith; and
- a translating stage operatively engaged with the tool and driven for linear translation of the tool relative to the rotatable stage along the axis of rotation of the rotatable stage,
- rotation of the rotatable stage causing the tool to rotate around the axis of rotation for aligning the tool with the substrate.

19. The alignment apparatus of claim 18 in which the chuck is movable along two orthogonal axes in the plane, and in which the substrate includes an array of circuits arranged in a predetermined array pattern, the array pattern having an angular misalignment relative to the orthogonal axes, and further comprising:
- a computer-readable data storage medium adapted to store an indexing plan corresponding to the array pattern, the indexing plan including a set of movement vectors that represent spatial offsets between the sets of contact areas of one or more pairs of the circuits of the array;
- a position sensor for measuring the angular misalignment of the array pattern; and
- a computer processor in communication with the data storage medium and the position sensor, the computer processor operable to perform coordinate transformations on the movement vectors based on the angular misalignment of the array pattern measured by the position sensor.

20. The alignment apparatus of claim 18 in which the rotatable stage includes a ring bearing.

21. The alignment apparatus of claim 18 in which the translating stage is supported on the rotatable stage for movement therewith.

* * * * *

UNITED STATES PATENT AND TRADEMARK OFFICE
CERTIFICATE OF CORRECTION

PATENT NO. : 7,119,566 B2  Page 1 of 1
APPLICATION NO. : 10/393955
DATED : October 10, 2006
INVENTOR(S) : Kyung Y. Kim It is certified that error appears in the above-identified patent and that said Letters Patent is hereby corrected as shown below:

Queries/remarks:
In the claims:

Replace claim 13 with the following claim 13:
Col. 9, Line 60 should read

--13. The probe alignment apparatus of claim 10, further comprising a workpiece positioning stage supporting a chuck and driven for movement in the plane independently of the rotational movement of the θ stage.--

Replace claim 16 with the following claim:
Col. 10, Line 8 should read

--16. The probe alignment apparatus of claim 10 in which the Z-stage is supported on the θ stage for movement therewith.--

Signed and Sealed this

Eighteenth Day of September, 2007

JON W. DUDAS
*Director of the United States Patent and Trademark Office*